(12) United States Patent
Butler et al.

(10) Patent No.: US 7,704,883 B2
(45) Date of Patent: Apr. 27, 2010

(54) ANNEALING TO IMPROVE EDGE ROUGHNESS IN SEMICONDUCTOR TECHNOLOGY

(75) Inventors: Stephanie W. Butler, Richardson, TX (US); Yuanning Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 246 days.

(21) Appl. No.: 11/615,456

(22) Filed: Dec. 22, 2006

(65) Prior Publication Data

US 2008/0150045 A1 Jun. 26, 2008

(51) Int. Cl.
*H01L 21/302* (2006.01)
*H01L 21/461* (2006.01)

(52) U.S. Cl. .............. 438/689; 257/E33.074; 257/E29.106; 257/E21.012; 257/E21.013; 257/E21.028

(58) Field of Classification Search .......... 438/158, 438/689; 257/739, 384, 65, E23.074, E29.106, 257/E21.012, E21.013, E21.028; 134/28
See application file for complete search history.

(56) References Cited

U.S. PATENT DOCUMENTS

| | | | | |
|---|---|---|---|---|
| 5,394,012 A | * | 2/1995 | Kimura | 257/739 |
| 5,581,092 A | * | 12/1996 | Takemura | 257/65 |
| 5,658,807 A | * | 8/1997 | Manning | 438/158 |
| 6,794,313 B1 | * | 9/2004 | Chang | 438/770 |
| 6,884,672 B1 | | 4/2005 | Balasubramanyam et al. | |
| 6,933,577 B2 | * | 8/2005 | Cabral et al. | 257/384 |
| 7,306,681 B2 | * | 12/2007 | Cheng et al. | 134/28 |
| 2005/0148142 A1 | | 7/2005 | Cabral et al. | |
| 2005/0214987 A1 | | 9/2005 | Shah et al. | |
| 2006/0214231 A1 | | 9/2006 | Shah et al. | |

* cited by examiner

*Primary Examiner*—Davienne Monbleau
*Assistant Examiner*—Monica D Harrison
(74) *Attorney, Agent, or Firm*—Warren L. Franz; Wade J. Brady, III; Frederick J. Telecky, Jr.

(57) ABSTRACT

A method for manufacturing a semiconductor device. The method comprises depositing a material layer on a semiconductor substrate and patterning the material layer with a patterning material. Patterning forms a patterned structure of a semiconductor device, wherein the patterned structure has a sidewall with a roughness associated therewith. The method also comprises removing the patterning material from the patterned structure and annealing an outer surface of the patterned structure such that the roughness is reduced.

13 Claims, 5 Drawing Sheets

US 7,704,883 B2

ANNEALING TO IMPROVE EDGE ROUGHNESS IN SEMICONDUCTOR TECHNOLOGY

TECHNICAL FIELD

The disclosure is directed in general to the manufacture of semiconductor devices and, more specifically, to the fabrication of a patterned structure for the semiconductor device.

BACKGROUND

Many integrated circuit manufacturing processes involve the use of a patterning material to facilitate the fabrication of device components. Typically an image in the patterning material is transferred into a material layer of the device. Inherent irregularities in the image transferred into the material layer are often referred to in the field as edge roughness or line edge roughness. As new technologies are implemented to produce smaller device components, line edge roughness become increasingly problematic because it accounts for an increasingly large amount of error in the device component's desired size or shape. Unintended variations in the size or shape of device components can, in turn, cause the device to not perform as expected.

Accordingly, what is needed is a method for forming patterned structures of devices with less line edge roughness.

SUMMARY

One embodiment is a method for manufacturing a semiconductor device. The method comprises depositing a material layer on a semiconductor substrate and patterning the material layer with a patterning material. Patterning forms a patterned structure of a semiconductor device, wherein the patterned structure has a sidewall with a roughness associated therewith. The method also comprises removing the patterning material from the patterned structure and annealing an outer surface of the patterned structure such that the roughness is reduced.

Another embodiment comprises a method of manufacturing an integrated circuit. The method comprises depositing a polysilicon layer over a semiconductor substrate, and depositing and patterning a photoresist layer on the polysilicon layer. The method also comprises patterning the polysilicon layer to form a gate electrode having a sidewall, the sidewall having a line edge roughness associated therewith. The method further comprises surface annealing an outer shell of the gate electrode with a laser to thereby reduce line edge roughness of the gate. The method also comprises forming an oxide layer over the surface annealed gate electrode, implanting dopants into the surface annealed gate electrode and the substrate, and performing an activating anneal to diffuse the implanted dopants.

Yet another embodiment is a metal oxide semiconductor (MOS) device. The device comprises a gate dielectric layer on a substrate and a gate electrode on the gate dielectric layer. The gate electrode comprises an outer shell that discernable from an interior core of the gate electrode provides the devices.

DETAILED DESCRIPTION

Efforts to reduce line edge roughness include using new types of patterning material or improving upon the processes to transfer an image into the patterning material or into a material layer. In contrast to such efforts, the present disclosure describes reducing line edge roughness in a material layer that has already been patterned.

One embodiment is directed to manufacturing a semiconductor device. FIGS. 1 to 7 illustrate cross-sectional or plan views of selected steps in an example implementation of a method of fabricating semiconductor device 100 of the disclosure. Some embodiments of the semiconductor device comprise an integrated circuit. Some embodiments of the semiconductor device 100 comprise gate-containing devices such as a transistor device 102. Non-limiting examples comprise MOS semiconductor devices including p-type channel metal oxide semiconductor (pMOS) and n-type channel metal oxide semiconductor (nMOS) field effect transistors (MOSFET). Other embodiments of the semiconductor device 100 comprise combinations of transistor devices 102, such as complementary metal oxide semiconductor (CMOS) devices. Other embodiments of the semiconductor device 100 comprise bipolar transistor devices (e.g., a heterojunction bipolar transistor). Other embodiments of the semiconductor device 100 comprise multi-gate transistors. E.g., the device 100 can comprise a multi-gate field effect transistor (MUG-FET) having a gate electrode whose sidewall roughness is reduced using the methods disclosed herein.

Figure 1:
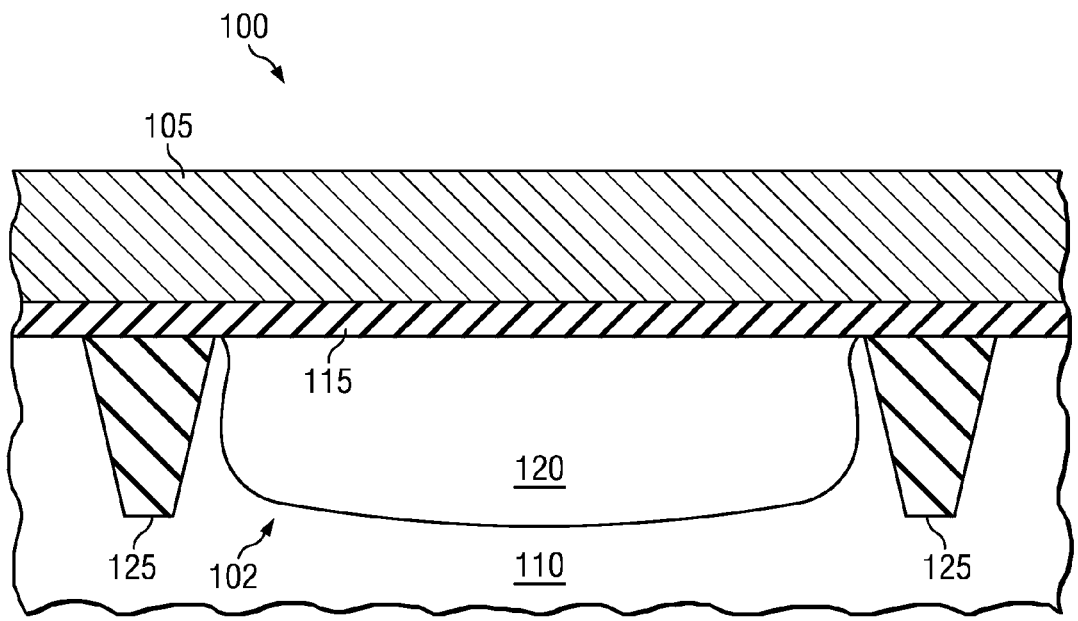
FIGS. 1 to 7 illustrate cross-sectional and plan views of selected steps in an example implementation of a method of fabricating semiconductor devices of the disclosure.

The method includes depositing a material layer 105 on a semiconductor substrate 110 (FIG. 1). Any conventional deposition process, including CVD, physical vapor deposition (PVD), atomic layer deposition (ALD), or combinations thereof, can be used to form the material layer 105. In some cases, the material layer 105 can be deposited on a dielectric layer 115, such as a gate dielectric layer, or on other layers that are on the substrate 110.

Embodiments of the substrate 110 include bulk silicon substrates, semiconductor on insulator substrates, such as a silicon-on-oxide (SOI) substrate, including strained silicon on insulator, such as silicon germanium-on-insulator, or other materials such as germanium-on-insulator. The substrate 110 can be doped with suitable dopants to form a doped well 120 for the transistor device 102. Shallow trench isolation (STI) structures 125 comprising e.g., CVD deposited silicon oxide can be formed in the substrate 110 to electrically isolate the transistor device 102 from other adjacent devices formed in the substrate 110.

The material layer 105 can be made of any substance that can be incorporated into a semiconductor device. At least a portion of the material layer 105 is retained in the device's final structure. In some cases the material layer 105 comprises polysilicon, including combinations of polysilicon and metal, or polysilicon and a metal silicide. In other cases, the material layer 105 comprises metal or a metal silicide. Example metal and metal silicide material layers include metal or a metal silicide, titanium, chromium, manganese, zirconium, tantalum, tungsten, cobalt, nickel, molybdenum, ruthenium, rhodium, palladium, rhenium, iridium, platinum, gold, and mixtures thereof including alloys, nitrides (e.g., tantalum nitride) and silicides (e.g., cobalt silicide). Another example is polysilicon germanium.

Figure 2:
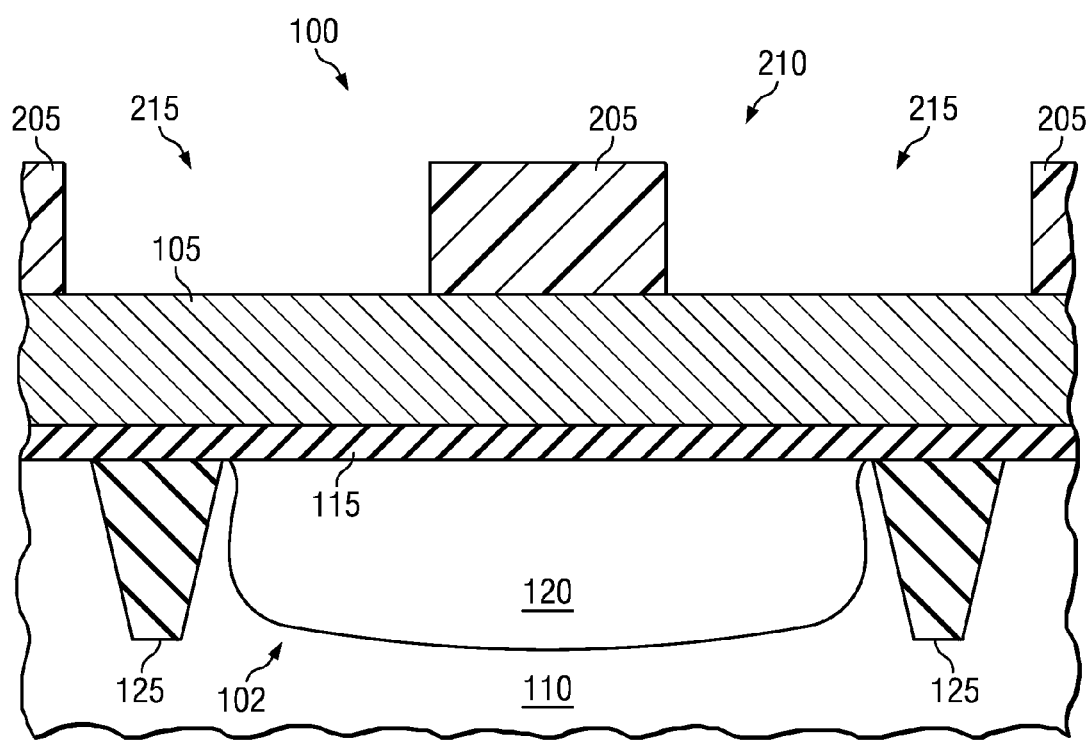

FIG. 2 shows a cross-sectional view of the device 100 after depositing a patterning material 205 (e.g., a photoresist, hardmask or combination thereof) on the material layer 105 and developing a pattern 210 in the patterning material 205. Conventional lithographic methods can be used to, e.g., transfer a positive or negative pattern 210 (e.g., a photomask image) of a desired device structure into the patterning material 205 by exposing a photosensitive patterning material 205 to electromagnetic radiation (e.g., ultraviolet light), to thereby form one or more openings 215 in the patterning material 205.

Figure 3A:
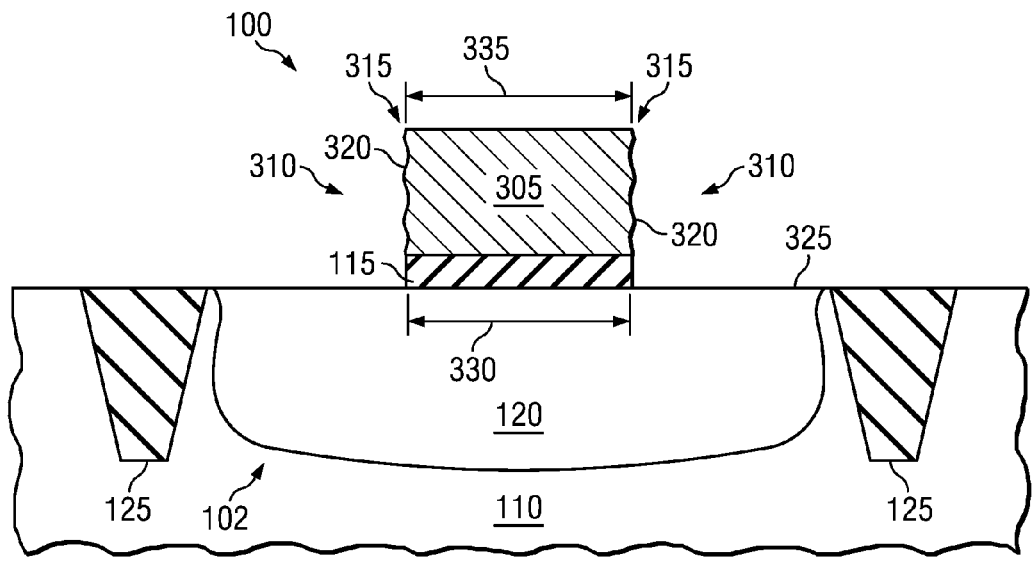
Figure 3B:
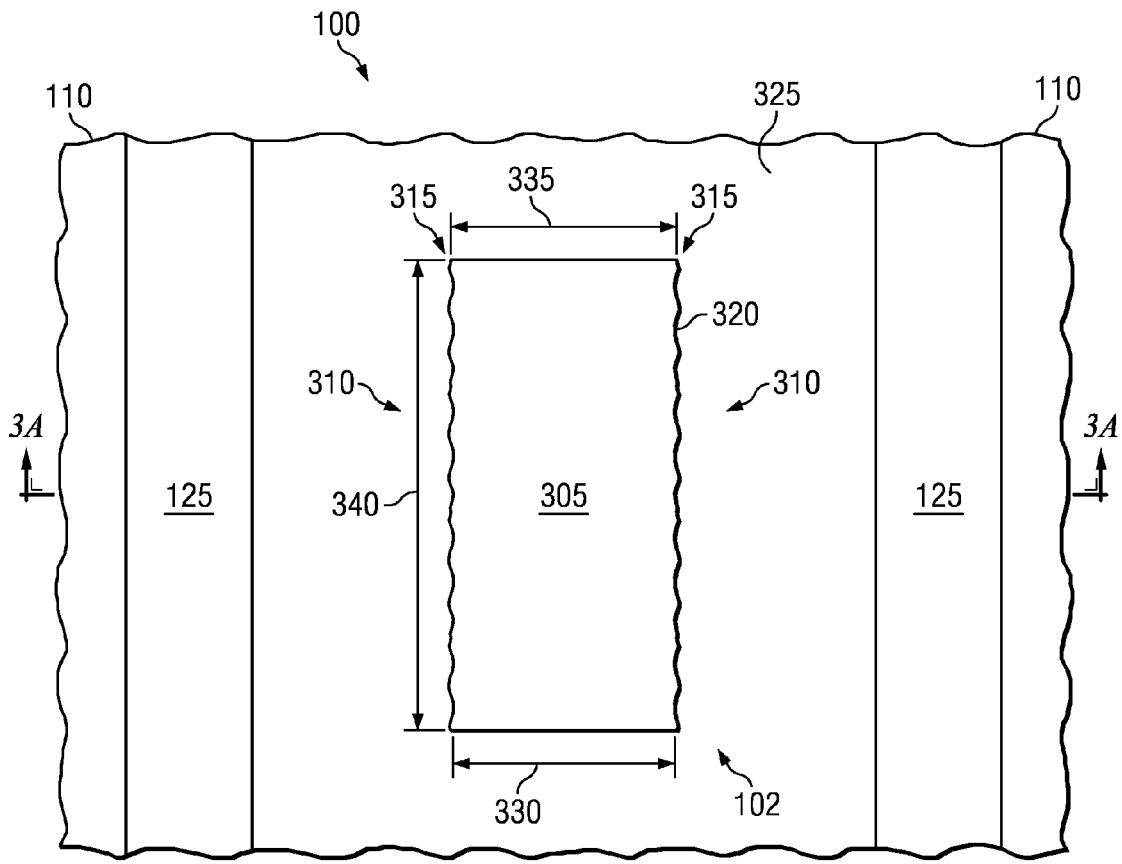

FIG. 3A shows a cross-sectional view the device 100 after patterning the material layer 105 with the patterning material 205 (FIG. 2) to form a patterned structure 305 of the device 100. FIG. 3B shows a plan view of the device 100 at the same stage of manufacture as shown in FIG. 3A. The cross-sectional view in FIG. 3A is taken along view line 3A-3A in FIG. 3B. Processes such as plasma etching can be used to remove portions of the material layer 105 that are exposed by the openings 215 (FIG. 2). FIGS. 3A and 3B also show the device after removing the patterning material 205 (FIG. 2) from the patterned structure 305. E.g., a plasma ash, a solvent wash or other conventional process can be used to strip the patterning material 205 away from the patterned structure 305.

The patterned structure 305 is a component of the device 100. The patterned structure 305 has one or more sidewalls 310 with a roughness 315 associated therewith. The term sidewall 310 as used herein refers to an outer surface 320 of the patterned structure that is substantially perpendicular (e.g., 90±10degrees) to a planar surface 325 of the substrate 110. The term roughness 315 as used herein refers to variations in the sidewall 310 of the patterned structure 305. In some cases, the roughness 315 can be characterized by the standard deviation in a length 330 of one dimension (e.g., a gate length) about an average length 335 of the patterned structure 305. One of ordinary skill in the art would understand how to measure roughness using procedures such as described in H. Fukutome et al., "Direct Evaluation of Gate Line Edge Roughness Impact on Extension Profiles in Sub-50-nm n-MOSFETs,"IEEE Trans. Elec. Dev., vol. 53 no. 11, pp 2755-2763 (Nov. 2006), incorporated by reference herein in its entirety, or using other conventional procedures.

The roughness 315 in a patterned structure 305 can be detrimental to the performance of the device 100. Consider the case where the patterned structure 305 comprises all or a portion of a MOSFET transistor gate electrode, and the roughness 315 is a gate line edge roughness. In such cases, the roughness 315 contributes to variations in the leakage current from the source to drain across the width 340 of the gate structure 305. The roughness 315 can contribute to variability in the threshold voltage for a transistor. Even if the change in the performance in a particular device 100 is itself not undesirable, simply having variations in the performance from one device 100 to the next, due, e.g., to random variations in the roughness 315, can be undesirable.

Figure 4A:
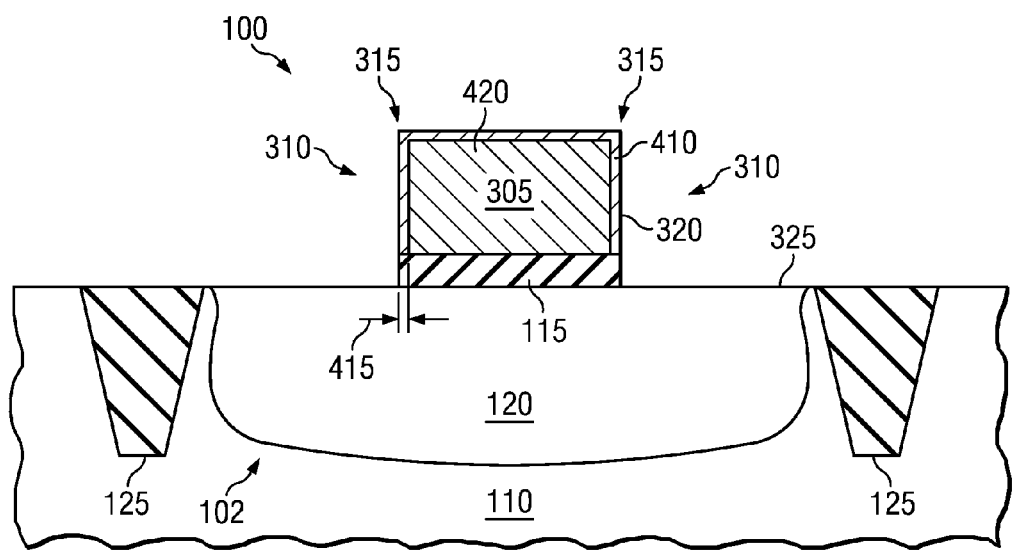
Figure 4B:
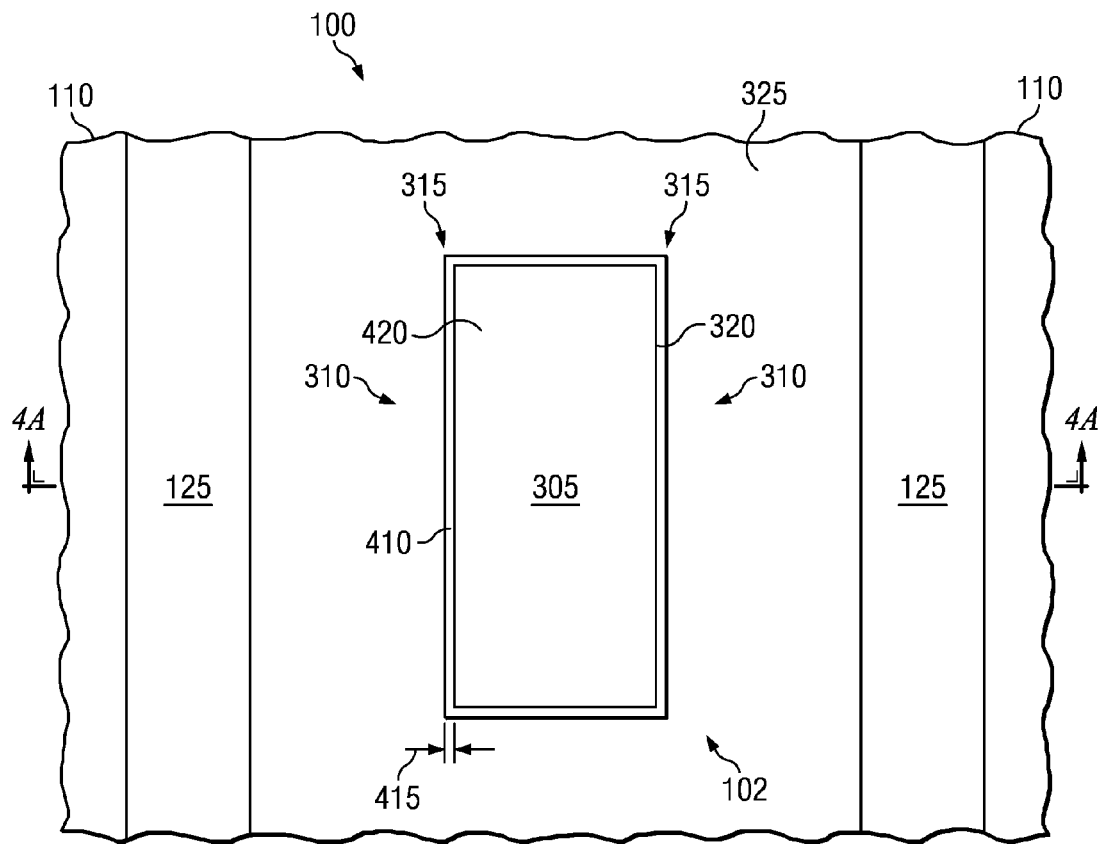

FIGS. 4A and 4B show, respectively, cross-sectional and plan views of the semiconductor device 100 analogous to those shown in FIGS. 3A and 3B, but after annealing an outer surface 320 of the patterned structure 305 such that the roughness 315 is reduced. E.g., the roughness 315 of the annealed patterned structure 305 depicted in FIGS. 4A and 4B is less than the roughness 315 of the pre-annealed patterned structure 305 depicted in FIGS. 3A and 3B. In some cases, the roughness 315 is substantially less, e.g., about 10 to 50percent less. E.g., in some cases when the line edge roughness 315 of the pre-annealed patterned structure 305, configured, e.g., as a transistor gate electrode, is about 4 nm, then the roughness 315 after annealing is less than about 4 nm, and in some cases about 3.6 nm to 2 nm or less. One skilled in the art would appreciate that the roughness could vary depending on the particular patterned structure 305 formed and the processes used to form such structures.

In some cases, annealing comprises surface annealing to form an outer shell 410 of the patterned structure 305 to thereby reduce the line edge roughness 315 of the structure 305. The term outer shell 410 as used herein refers to an outer thickness of the patterned structure 305. In some cases, the outer shell's thickness 415 is equal to or less than about 10 percent of an average length 335 of the patterned structure 305. E.g., in embodiments where the patterned structure 305, configured as a gate electrode, has a gate length 335 of about 40 nm, then the outer shell's thickness 415 is about 4 nm or less.

In some embodiments, the outer shell 410 is discernable from an interior core 420 of the patterned structure 305 in an atomic scanning electron microscopic (SEM) image of the patterned structure 305. E.g., the outer shell 410 can appear as a hyper-intense region in an SEM image, using a 1 kV bias.

In some embodiments, the anneal can cause substantially all of the entire outer surface 320 of the patterned structure 305 having roughness 315 (FIG. 3) to be briefly melted and re-solidified to a smoother surface, while the interior core 420 is not melted. In such cases, the outer shell 410, corresponds to the portion of the patterned structure 305 that was melted and re-solidified, or partially melted and reflowed. In some cases, the outer shell 410 has a thickness 415 that is equal to or greater than the roughness 315 of the pre-annealed patterned structure 305. E.g., when the roughness of the pre-annealed patterned structure 305 (FIG. 3) is about 4 nm, then the outer shell's thickness 415 can equal about 4 nm or greater.

In some cases, annealing comprises a laser anneal, while in other cases, the anneal comprises an arc or flash anneal. The particular type of anneal process used is based on its suitability for annealing the type of material the patterned structure 305 comprises. E.g., when the patterned structure 305 comprises polysilicon, a laser anneal may be more suitable than an arc or flash anneal. When the patterned structure 305 comprises a metal, an arc or flash anneal may be more suitable than a laser anneal, or visa versa.

It is important to heat the patterned structure 305 long enough to reduce the roughness 315 of the outer surface 320 but not so long as to alter the overall shape and dimensions of the patterned structure 305. In some embodiments, the anneal comprises heating the outer surface 320 to a temperature ranging from about 1100 to 1400° C., for a time of 200 ms or less, and in some cases, from about 0.1 to 200 ms. E.g., the outer shell 410 of a patterned structure 305 comprising polysilicon can be surface annealed with a laser in such temperature ranges to thereby reduce the line edge roughness of a patterned structure 305 configured, e.g., as a gate electrode. In some cases a shorter time can be used to minimize the thermal budget to which the device 100 is exposed. E.g., in some cases, the time ranges from about 0.1 to 20 ms. In other cases, the laser anneal comprises adjusting a temperature of the outer surface 320 in the range of about 1100 to 1200° C. for about 1 to 3 ms, and in other cases, about 1120° C. for about 1.6 ms.

In other embodiments, the anneal comprises heating the outer surface 320 to a temperature ranging from about 600° C. to 1000° C. for a time of 200 ms or less, and in some cases from about 1 to 200 ms, and in some cases from about 1 to 20 ms. E.g., the outer shell 410 of a patterned structure 305 comprising a metal can be surface annealed with a flash or arc lamp to achieve such temperature to thereby reduce the line edge roughness of the patterned structure 305 configured, e.g., as a gate electrode. In some cases, however, the patterned structure 305 comprising a metal can be surface annealed using a laser. Likewise, in some cases, the patterned structure 305 comprising polysilicon can be surface annealed using a flash or arc lamp.

Figure 5:
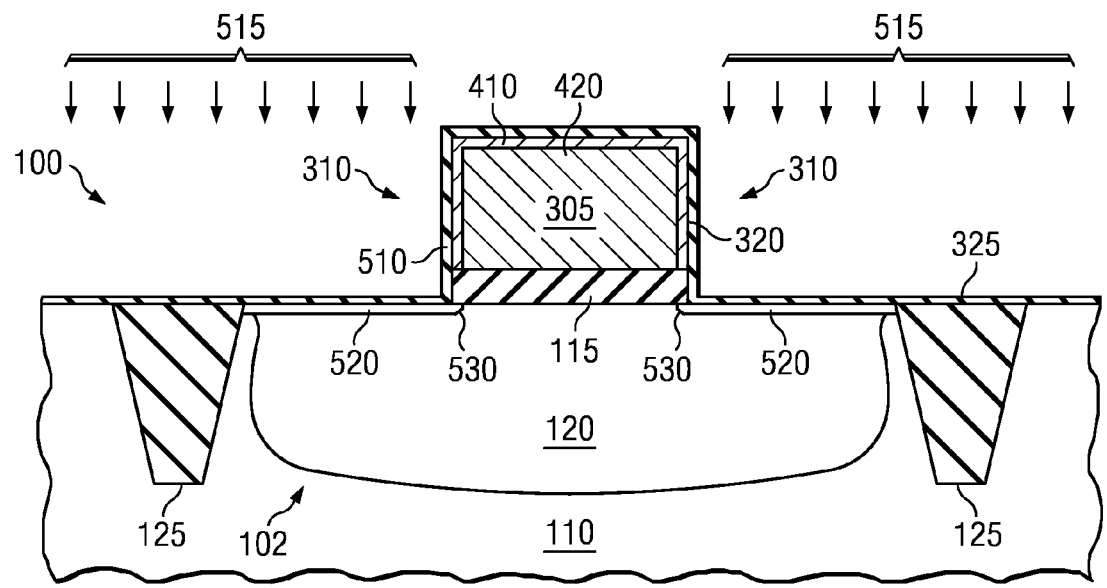

After annealing the patterned structure 305 to reduce its roughness 315, other device components may formed in or on the patterned structure 305. FIG. 5 shows the device 100 after further depositing one or more insulating layers 510 (e.g., one or more silicon oxide or silicon nitride layers), or growing such layers, over the patterned structure 305. E.g., when the patterned structure 305 is configured as a transistor gate electrode, the insulating layer 510 can be used as a sidewall spacer. Roughness 315 in the patterned gate electrode structure 305 can, in turn, be imparted into the sidewall spacers 510.

FIG. 5 also shows the device while implanting dopants 515 (e.g., n- or p-type dopants) into the patterned structure 305 or the substrate 110. The patterned structure 305 (configured as a gate electrode) and insulating layer 510 (configured as optional sidewall spacers) can serve as masks to direct the dopants 515 into extension regions 520 of the substrate 110. In some cases, gate dopant implantation is done concurrently with dopant implantation for the extension region 520. However, appropriate masking steps can be performed to implant different amounts or types of dopants into the patterned structure other than the extension regions 520, if desired. One of ordinary skill in the art would understand how to select the type and adjust the implantation dose for the device 100 of interest.

Roughness 315 in the gate electrode structure 305 or insulating layers 510 configured as sidewall spacers can contribute to variations in the shape of the doped regions 520. E.g., the dopants 515 can be implanted such that a boundary 530 of the doped region 520 corresponds to the rough edge 315 of the patterned structure 305. Variations in the boundary 530 of doped regions 520 can, e.g., cause variations in the size and shape of subsequently formed extension regions. Variations in extension regions can, in turn, alter the intended size of a transistor channel of a MOSFET device 100, thereby contributing to an undesirably high or variable transistor threshold voltage or high off-current. By annealing the outer surface 320 of the patterned structure 305 before implanting the dopants 515, such as discussed above in the context of FIG. 4, variations in the boundary 530 of the doped regions 520 can be mitigated.

Figure 6:
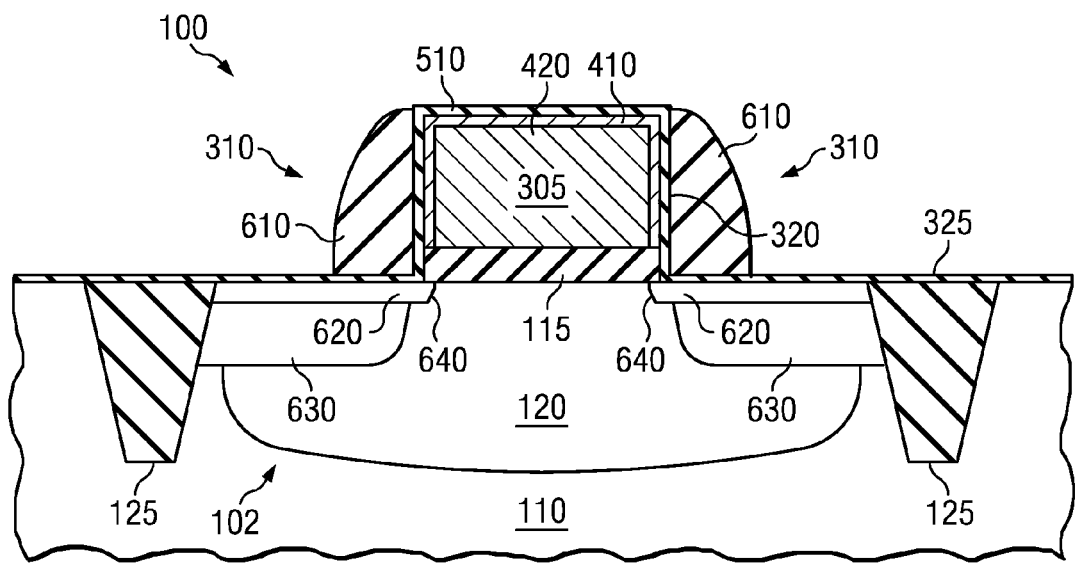

FIG. 6 shows the device 100 depicted in FIG. 5 after forming gate sidewalls 610 (e.g., silicon oxide sidewalls) around the patterned structure 305, and then implanting source/drain dopants (e.g., n- or p-type dopants) into the patterned structure 305 or substrate 110. The patterned structure 305 can be masked to control its exposure to source/drain dopants, if desired.

FIG. 6 also shows the device 100 after performing an activating anneal. The activating anneal is configured to activate the implanted dopants 515 (FIG. 5) and source/drain dopants. The activating anneal may also diffuse the dopants 515 in the patterned structure 305 or substrate 110. E.g., the activating anneal facilitates the formation of the extension regions 620 from the doped regions 520 (FIG. 5). The activating anneal can also facilitate the diffusion of implanted source/drain dopants to form source/drain regions 630. The activating anneal is typically configured to avoid melting and thereby damaging any device components, including melting any portion of the patterned structure 305. E.g., melting could change the shape of a patterned structure 305 configured as a gate electrode, thereby detrimentally affecting the operating characteristics of the device 100.

Because the patterned structure 305 was annealed before dopant 515 implantation (FIGS. 4 and 5), the boundary 640 of the extension regions 620 has less roughness than comparable structures formed without the annealing step discussed in the context of FIG. 4. E.g., in some embodiments of the device 100, the boundary 640 has a roughness of about 4 nm or less. The roughness of the boundary 640 can be measured using scanning tunneling microscopy or scanning capacitance microscopy.

Figure 7:
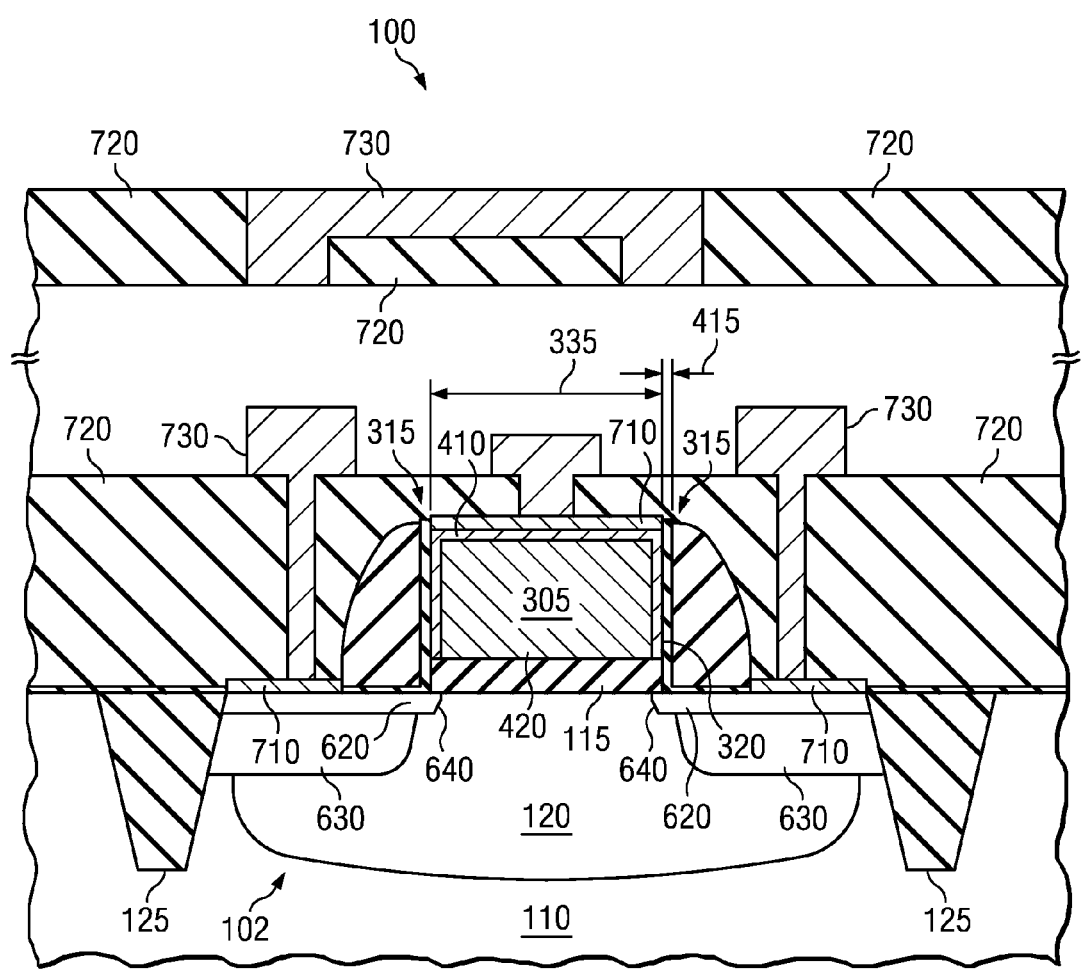

FIG. 7 shows the semiconductor device 100 after forming metal silicide contacts 710 on the patterned structure 305, extension regions 620 and source/drain regions 630. One skilled in the art would be familiar with the conventional processes to remove portions of the insulating layer 510 over the patterned structure 305 and doped regions 620, 630, deposit an electrode metal layer (e.g., cobalt or nickel) and then perform an anneal (e.g., temperature ranging from about 300 to 500° C.), to cause the metal to react (e.g., alloy) with the silicon of the substrate 110 or patterned structure 305, to form the contacts 710. FIG. 7 also shows the device 100 after forming insulating layers 720 over the device 100 and forming interconnections 730 that contact the metal silicide contacts 710. Those skilled in the art would be familiar with other steps that may be required to complete the fabrication of the semiconductor device 100, configured as, e.g., an integrated circuit.

FIG. 7 also illustrates another embodiment, a metal oxide semiconductor (MOS) device. In some cases, the MOS device is configured as an integrated circuit. The device can comprise one or more transistor 102 (e.g., pMOS, nMOS, MOSFET or bipolar transistors). Any of the above-described embodiments of the method for making the semiconductor device and such, discussed above in the context of FIGS. 1-5, can be used to form the MOS device 100. E.g., the MOS device 100 can comprise a gate dielectric layer 115 on a substrate 110 and a gate electrode 305 (e.g., a polysilicon gate electrode or metal gate electrode of combination thereof) on the gate dielectric layer 115. Some embodiments of the gate electrode are formed by a process that includes annealing the outer surface 320 of gate electrode 305. In some cases, annealing the outer surface 320 of gate electrode 305 forms an outer shell 410. In some embodiments, the outer shell 410 is discernable from an interior core 420 of the gate electrode 305.

E.g., the outer shell 410 can be characterized as having a hyper-intensity in a scanning electron microscopic image of the gate electrode 305. Embodiments of the outer shell 410 comprise a surface-annealed portion of the gate electrode 305, and in some cases the outer shell 410 has a thickness 415 that is about 10 percent of the length 335 of the gate electrode 305. Some embodiments of the gate electrode 305 have an average length 335 ranging from about 40 to 60 nm. The line edge roughness 315 of the gate electrode 305 is thereby reduced. E.g., in some cases the line edge roughness 315 is 4 nm or less.

The device 100 can also comprise extension regions 620 in the substrate 110. Embodiments of the extension regions 620 can have a boundary roughness 640 that is reduced compared the conventionally-formed devices. E.g., in some embodiments the boundary roughness 640 that is about 4 nm or less.

Those skilled in the art to which the invention relates will appreciate that other and further additions, deletions, substitutions and modifications may be made to the described example embodiments, without departing from the invention.

What is claimed is:

1. A method for manufacturing a semiconductor device, comprising:

depositing a material layer comprising polysilicon on a semiconductor substrate;

patterning said material layer with a patterning material to form a patterned gate electrode structure of a semiconductor transistor device, wherein said patterned gate electrode structure has an outer sidewall surface with a gate line edge roughness associated therewith;

surface annealing said outer sidewall surface of said patterned gate electrode structure with a laser anneal to form an at least partially melted and re-solidified outer portion of said polysilicon comprising material of said gate electrode structure, such that said gate line edge roughness is reduced; and following said surface annealing, implanting dopant to form source/drain extension regions associated with said surface annealed gate structure.

2. The method of claim 1, wherein said material layer is polysilicon or polysilicon germanium.

3. The method of claim 1, wherein said patterned gate electrode structure comprises a metal-oxide-semiconductor transistor gate electrode structure.

4. The method of claim 1, wherein said surface annealing comprises heating said outer sidewall surface to a temperature ranging from about 1100° C. to 1400° C. for a time ranging from about 0.1 to 200 milliseconds.

5. The method of claim 1, further comprising depositing or growing one or more insulating layers over said surface annealed gate electrode structure.

6. The method of claim 1, further performing an activating anneal to diffuse said implanted dopant.

7. The method of claim 6, wherein said doped extension regions have a boundary with a roughness of about 4 nm or less.

8. The method of claim 1, wherein said patterning of said material layer includes depositing a layer of said patterning material over said material layer, patterning said layer of deposited patterning material, etching said material layer through said patterned layer of patterning material, removing said patterned layer of patterning material following said etching; and said surface annealing comprises surface annealing an outer shell portion of said patterned gate electrode structure including said outer sidewall surface and another outer surface portion exposed after removal of said patterned layer of patterning material.

9. A method of manufacturing an integrated circuit, comprising:

depositing a polysilicon layer over a semiconductor substrate;

patterning said polysilicon layer to form a gate electrode having a sidewall, said sidewall having a line edge roughness associated therewith;

surface annealing an outer shell of said gate electrode with a laser to thereby reduce said line edge roughness of said gate;

forming an oxide layer over said surface annealed gate electrode;

implanting dopants into said surface annealed gate electrode and said substrate; and performing an activating anneal to diffuse said implanted dopants.

10. The method of claim 9, wherein said surface-annealed gate electrode has an edge roughness of 4 nm or less.

11. The method of claim 9, wherein said implanted dopants and said activating anneal form doped extension regions in said substrate, said doped extension regions having a boundary with a roughness of 4 nm or less.

12. The method of claim 9, wherein said annealing includes adjusting a temperature of said outer shell in the range of about 1120 to 1200° C. for about 1 to 3 ms.

13. The method of claim 9, wherein patterning said polysilicon layer includes depositing and patterning a photoresist layer on said polysilicon layer; patterning said polysilicon layer by etching through said patterned photoresist layer; and removing said patterned photoresist layer following said patterning of said polysilicon layer.

* * * * *